(12) United States Patent
Hogan

(10) Patent No.: US 9,355,511 B2
(45) Date of Patent: May 31, 2016

(54) APPARATUSES AND METHODS FOR DISPLAYING FEEDBACK INDICATORS VIA A KEYPAD

(71) Applicant: Schlage Lock Company LLC, Indianapolis, IN (US)

(72) Inventor: Michael Patrick Hogan, Carmel, IN (US)

(73) Assignee: Schlage Lock Company LLC, Indianapolis, IN (US)

( * ) Notice: Subject to any disclaimer, the term of this patent is extended or adjusted under 35 U.S.C. 154(b) by 297 days.

(21) Appl. No.: 14/175,282

(22) Filed: Feb. 7, 2014

(65) Prior Publication Data

US 2014/0216113 A1 Aug. 7, 2014

Related U.S. Application Data

(60) Provisional application No. 61/761,824, filed on Feb. 7, 2013.

(51) Int. Cl.
| | |
|---|---|
| *G07C 9/00* | (2006.01) |
| *G09G 3/04* | (2006.01) |
| *H04B 17/318* | (2015.01) |
| *G01R 31/36* | (2006.01) |
| *H04B 17/23* | (2015.01) |

(52) U.S. Cl.
CPC .............. *G07C 9/00174* (2013.01); *G09G 3/04* (2013.01); *G01R 31/3689* (2013.01); *G07C 9/0069* (2013.01); *G09G 2340/14* (2013.01); *H04B 17/23* (2015.01); *H04B 17/318* (2015.01); *Y10T 70/8027* (2015.04)

(58) Field of Classification Search
CPC .......... G01R 31/3689; G07C 9/00174; G07C 9/0069; Y10T 70/8027; H04B 17/318; H04B 17/23; G09G 3/04; G09G 2340/14
USPC ......................................................... 362/501
See application file for complete search history.

(56) References Cited

U.S. PATENT DOCUMENTS

| | | | | |
|---|---|---|---|---|
| 5,179,325 A | * | 1/1993 | Aragon, Jr. ............. | E05B 17/10 315/129 |
| 7,760,091 B2 | * | 7/2010 | Comerford ......... | E05B 19/0005 340/568.1 |
| 2006/0114665 A1 | * | 6/2006 | Patino ...................... | H02J 7/35 362/88 |

* cited by examiner

*Primary Examiner* — Laura Tso
(74) *Attorney, Agent, or Firm* — Taft Stettinius & Hollister LLP

(57) ABSTRACT

Apparatuses and methods are disclosed for determining a condition of an electronic lock that may include a keypad, determining at least one of a plurality of keys of the keypad to illuminate based on the condition, and illuminating at least one of the keys on the keypad to indicate the condition and/or provide an audible feedback.

15 Claims, 24 Drawing Sheets

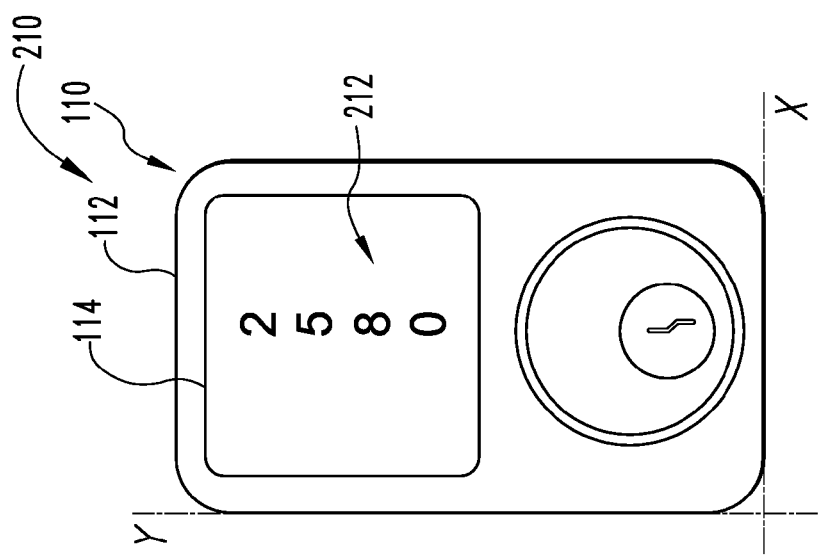

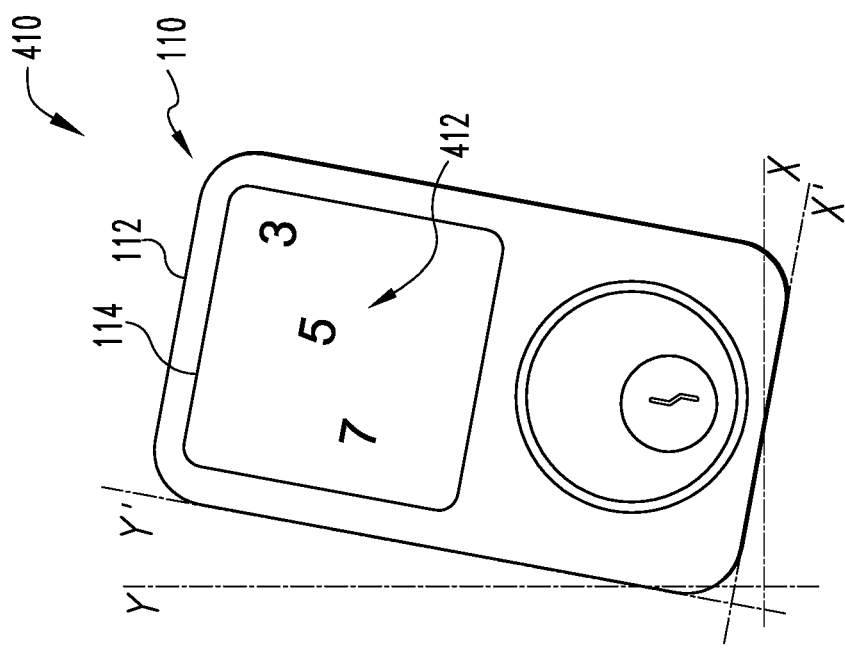

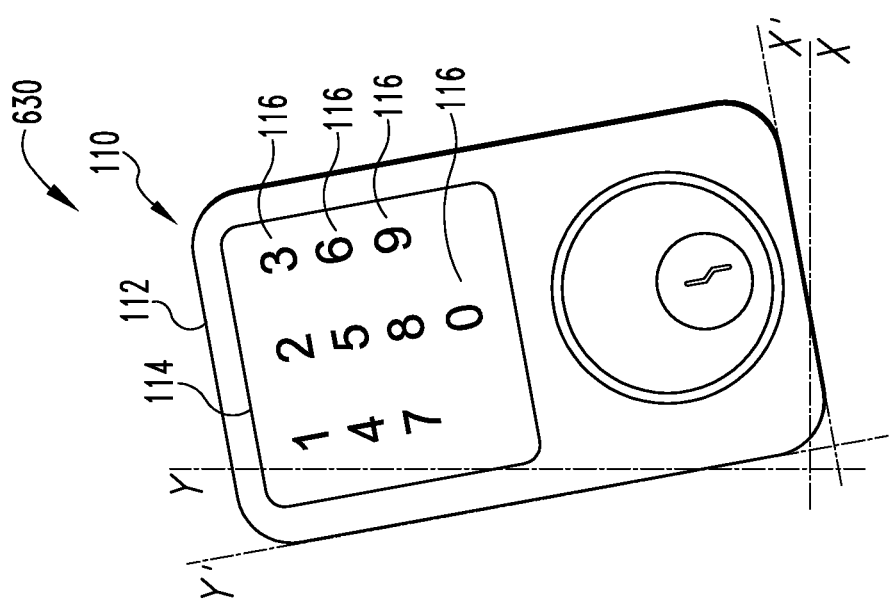

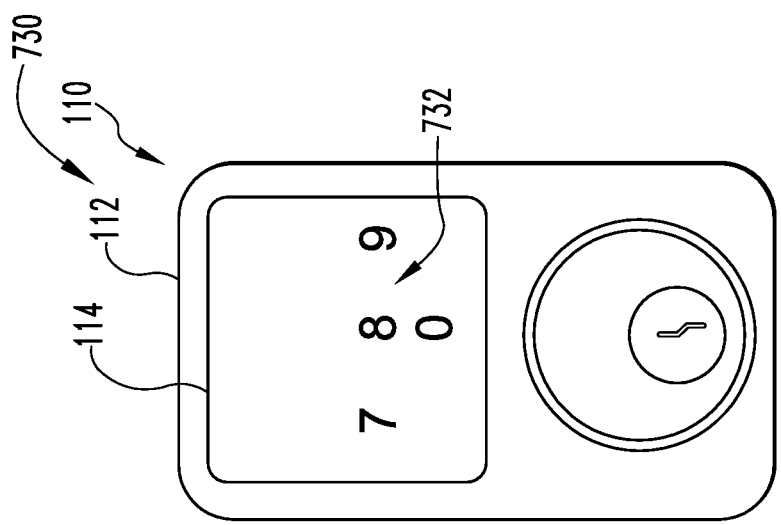

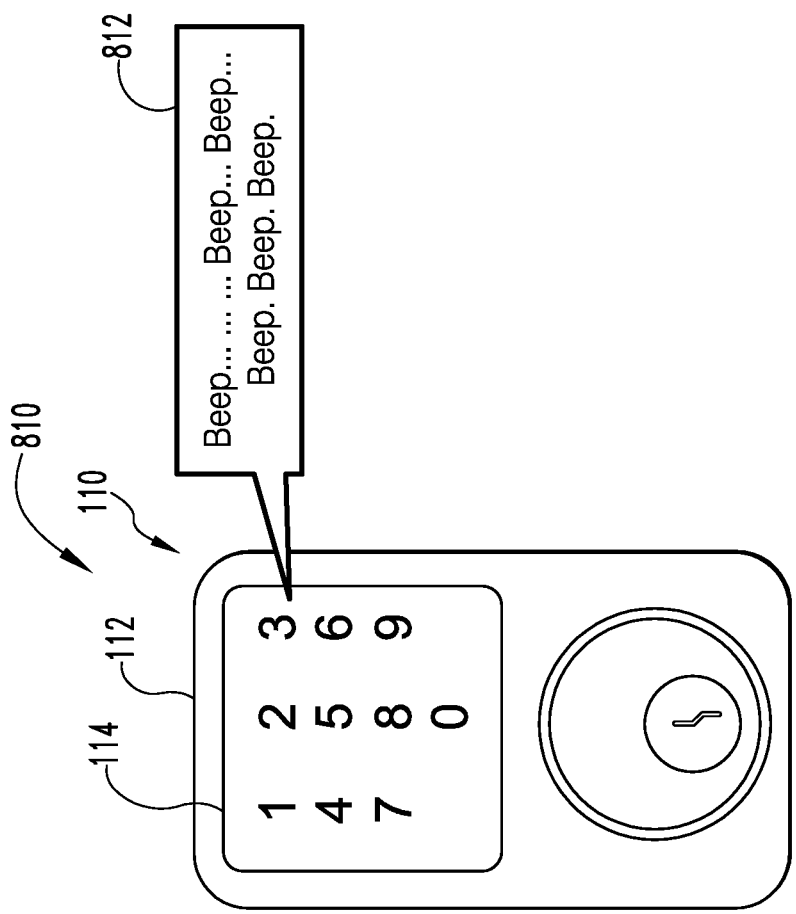

APPARATUSES AND METHODS FOR DISPLAYING FEEDBACK INDICATORS VIA A KEYPAD

CROSS-REFERENCE TO RELATED APPLICATION

The present application claims the benefit of Provisional Application No. 61/761,824 filed on Feb. 7, 2013, which is incorporated herein by reference in its entirety for all purposes.

BACKGROUND

Wireless home networks may include computing devices that may be connected by a wired or wireless connection to the home network and are often battery-powered. The home network administrator typically needs to know certain parameters, such as the signal strength and battery life, of these computing devices to ensure proper setup and maintenance of the overall system. Some of these home network computing devices do not display these parameters. These devices tend to be existing devices that have historically not been either battery-powered or wirelessly connected, but may have a keypad for user input. Some of these home automation devices may require them to be installed level, if for nothing more than aesthetic purposes. Adding a level indicator, a network signal strength indicator, and/or a battery life indicator would add costs, and also detract from the architectural styling. Some existing systems have various shortcomings relative to certain applications. Accordingly, there remains a need for further contributions in this area of technology.

SUMMARY

One embodiment is a unique method and apparatus to display a feedback indication of a level state of a device on a device keypad. Another embodiment is a unique method and apparatus to display a feedback indication of a battery life condition and/or a network signal strength of a device on a device keypad. Other embodiments include apparatuses, systems, devices, hardware, methods, and combinations for displaying information on devices. Further embodiments, forms, features, aspects, benefits, and advantages of the present application shall become apparent from the description and figures provided herewith.

BRIEF DESCRIPTION OF THE FIGURES

The description herein makes reference to the accompanying figures wherein like reference numerals refer to like parts throughout the several views, and wherein:

FIGS. 2A-2E are illustrations of exemplary embodiments for displaying a level indication of a zero tilt on an electronic lock keypad;

FIGS. 4A-4D are illustrations of exemplary embodiments for displaying a level position of a clockwise tilt on an electronic lock keypad;

FIGS. 6A-6D are illustrations of exemplary embodiments for displaying a level position of a counter-clockwise tilt on an electronic lock keypad;

FIGS. 7A-7E are illustrations of exemplary embodiments for displaying a battery life and/or a network signal indication on an electronic lock keypad; and FIGS. 8A-8C are illustrations of exemplary embodiments for emitting an audible feedback of a battery life and/or a network signal indication from an electronic lock keypad.

DESCRIPTION OF ILLUSTRATIVE EMBODIMENTS

Figure 1:
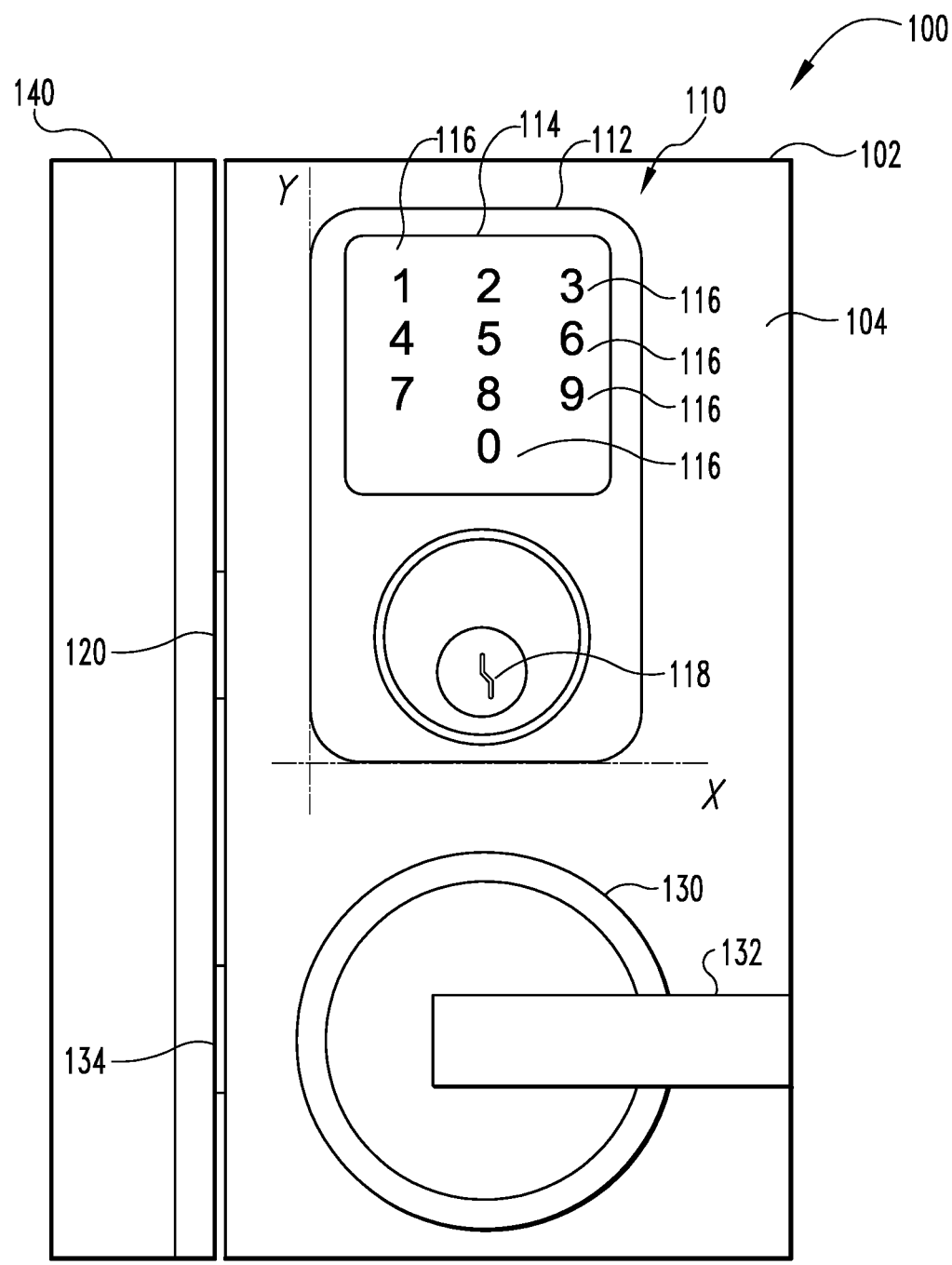
FIG. 1 is an illustration of exemplary embodiment of a system including an electronic lock with a keypad.

For the purposes of promoting an understanding of the principles of the invention, reference will now be made to the embodiments illustrated in the drawings and specific language will be used to describe the same. It will nevertheless be understood that no limitation of the scope of the invention is thereby intended, any alterations and further modifications in the illustrated embodiments, and any further applications of the principles of the invention as illustrated therein as would normally occur to one skilled in the art to which the invention relates are contemplated herein.

With reference to FIG. 1, there is illustrated an exemplary embodiment of a system 100 including an electronic lock 110 mounted on a lock stile 104 of a door 102 above a door handle 132 mounted to the lock stile 104 by a rose 130. A latch bolt 134 is operably connected to the door handle 132 for securing the door 102 to a strike, not shown, on an adjacent door jamb 140. It is contemplated that in certain embodiments the adjacent door jamb 140 may be an adjacent door, such as in a French door configuration, for example. Furthermore, it is contemplated that in other embodiments, the door lock 110 and the door handle 132 may be connected in one housing.

The electronic lock 110 includes a door lock housing 112, a keypad 114, and a key entry slot 118 operably connected to a deadbolt 120 for securing the door 102 to a strike, not shown, on the adjacent door jamb 140. The keypad 114 in the electronic lock 110 is a numeric keypad displaying numbers zero through nine on ten keys 116 in the layout illustrated in FIG. 1, where not all of the keys 116 have been identified to preserve clarity. The application is not intended to be limited to electronic lock 110 including a keypad display, but could be applied to other home automation appliances with similar characteristics. The present application allows a device to utilize its existing graphics or user interface, which was already required for normal operation, to indicate the status of various attributes (e.g., level position, batter life, signal strength, and the like) of the device. In certain embodiments, where the keypad 114 is on an alternative device, such as an electronic lock, a garage door opener, a home security system, a remote control, a telephone controller, or any other home/automation device with a keypad, for example, additional keys may be present.

Furthermore, it is contemplated that keys other than numeric keys on a keypad may be used to indicate status. For example, the keypad 116 may include other keys (not shown) to the right and/or left of the "0" key such as a check mark, an "X", an "*", and/or "#" that may be illuminated to indicate a status as discussed in the various embodiments below.

It is contemplated that in certain embodiments the keys 116 may be a type of physical button, such as a physical momentary or push button, a graphical button representation, such that may be presented on a resistive or capacitive touch touch-screen, or a combination thereof. It is further contemplated that the keys 116 have a light source (not shown) for illuminating the keys 116. In certain embodiments, the light source may be capable of displaying varying degrees of luminous intensity and/or different colors.

In certain embodiments, the electronic lock 110 may contain an accelerometer, a tilt sensor, a gyroscope, and/or other means known in the art capable of determining the degree of tilt of the electronic lock 110 relative to the X and/or Y axes as illustrated in FIG. 1. Various embodiments are contemplated for providing feedback to a user by illuminating one or more keys 116 on the keypad display 114 to indicate whether the electronic lock 110 is level (i.e. on a horizontal plane), at a clockwise tilt (i.e. at a positive degree of tilt from level), or at a counter-clockwise tilt (i.e. at a negative degree of tilt from level).

The electronic lock 110 may further contain a controller (not shown for clarity) that is configured to communicate with the keypad 114, the light source, and/or determine a level position from data from the accelerometer, the tilt sensor, the gyroscope, and/or the other means known in the art capable of determining the degree of tilt of the electronic lock 110 relative to the X and/or Y axes as illustrated in FIG. 1. The controller may be configured to interpret the electronic lock 110 level position and adjust a luminous intensity and/or a color of the light source based on the level position.

Figure 2B:
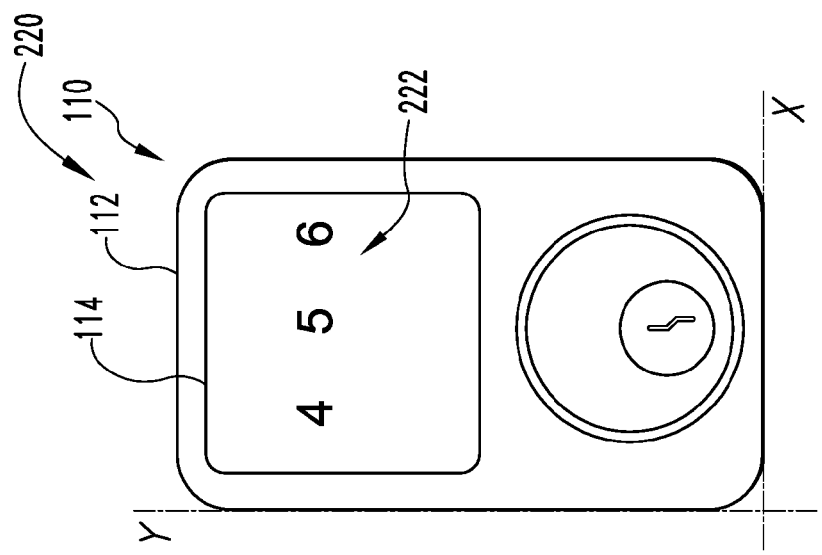
Figure 2C:
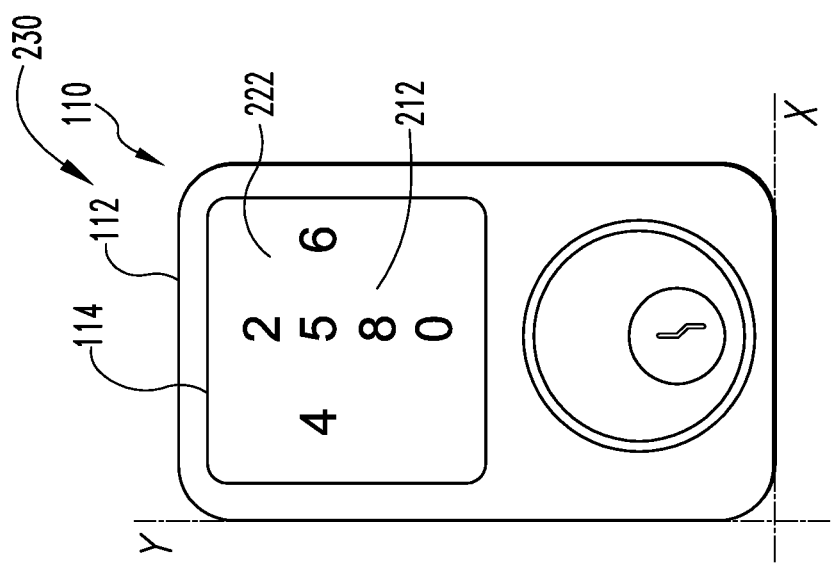
Figure 2D:
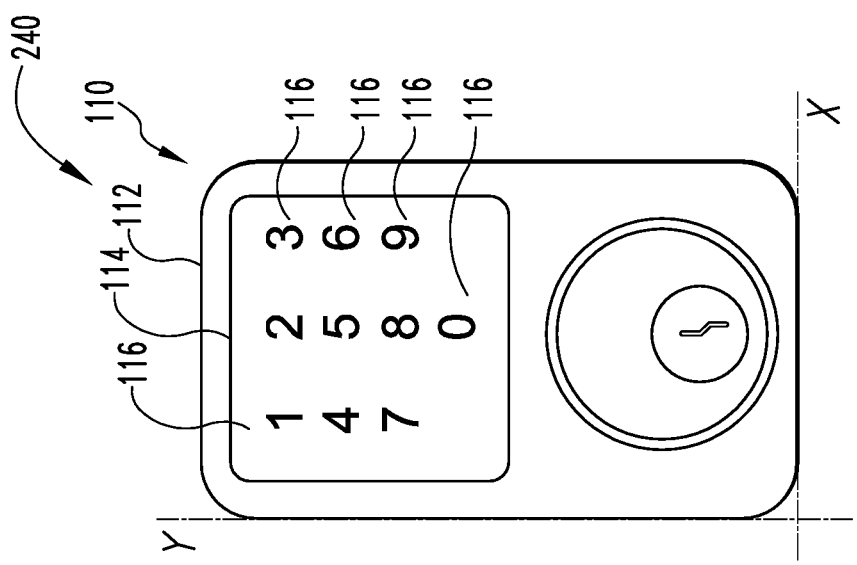
Figure 2E:
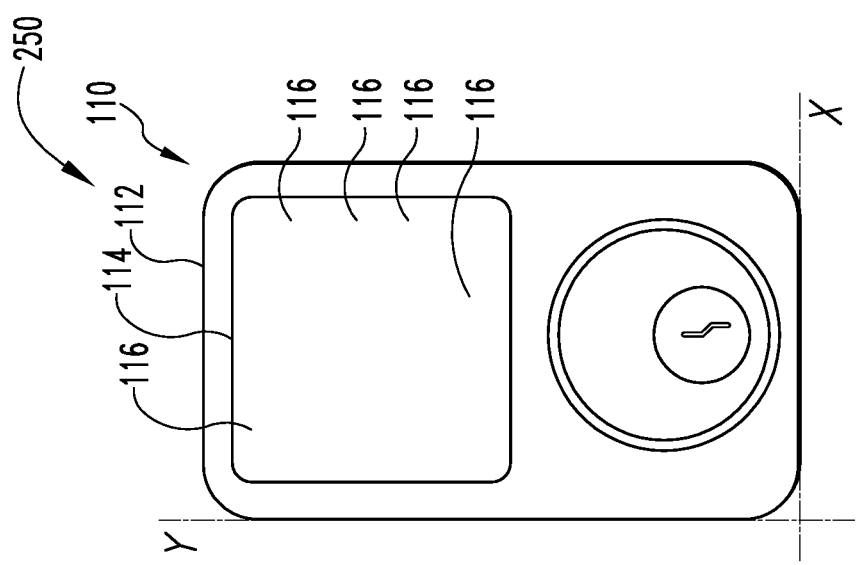

FIGS. 2A-2E illustrate various embodiments of the electronic lock 110 determining a level position (e.g., a level indication) with a device (e.g., an accelerometer) and displaying the level position on the keypad display 114. It is contemplated that aspects or features from the various embodiments in FIGS. 2A-2E may be combined with one another in other embodiments. With reference to FIG. 2A, there is illustrated a first level display embodiment 210, where a middle column 212 (i.e. two, five, eight, and zero) is a subset of keys 116 that are illuminated to indicate the electronic lock 110 is level. In a second level display embodiment 220 illustrated in FIG. 2B, the middle row 222 (i.e. four, five, and six) is a subset of keys 116 that are illuminated to indicate the electronic lock 110 is level. A third level display embodiment 230 is illustrated in FIG. 2C, where both the middle column 212 and the middle row 222 of keys 116 are a subset of keys 116 that are illuminated to indicate the electronic lock 110 is level. In a fourth level display embodiment 240 illustrated in FIG. 2D, all keys 116 are illuminated to indicate the electronic lock 110 is level. Additionally, all of the keys 116 are illuminated in a color indicative of the electronic lock 110 being level, such as green, for example. A fifth level display embodiment 250 is illustrated in FIG. 2E, in which all of the keys 116 are either completely illuminated (i.e. set to a maximum luminous intensity threshold) or not illuminated, whichever is specified as being assigned to indicate that the electronic lock 110 is level. It is contemplated that in certain embodiments the various subsets of illuminated keys, colors, and/or luminous intensities to indicate the electronic lock 110 being level may be combined.

Figure 3:
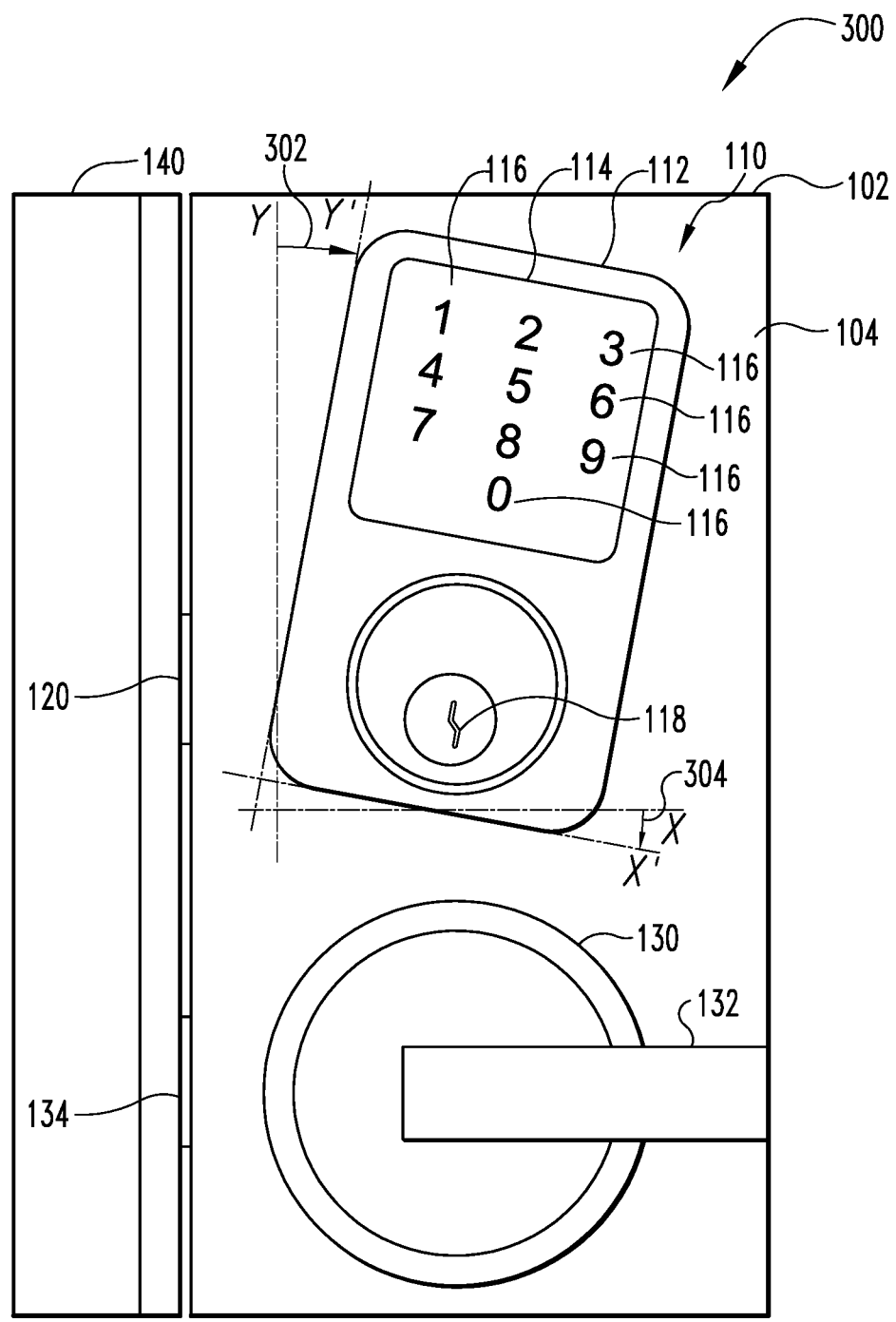
FIG. 3 is an illustration of an electronic lock with a keypad positioned at a clockwise tilt.

With reference to FIG. 3, there is illustrated the electronic lock 110 positioned at a clockwise tilt (i.e. at a positive degree of tilt from level). The illustrated embodiment includes a Y axis change 302 and an X axis change 304 depicting the electronic lock 110 at a 10° clockwise tilt, such that the electronic lock 110 resides along the X' and Y' axes relative to the level X and Y axes, respectively. The electronic lock 110 may be positioned on the lock stile 104 at varying degrees of clockwise tilt from level.

Figure 4B:
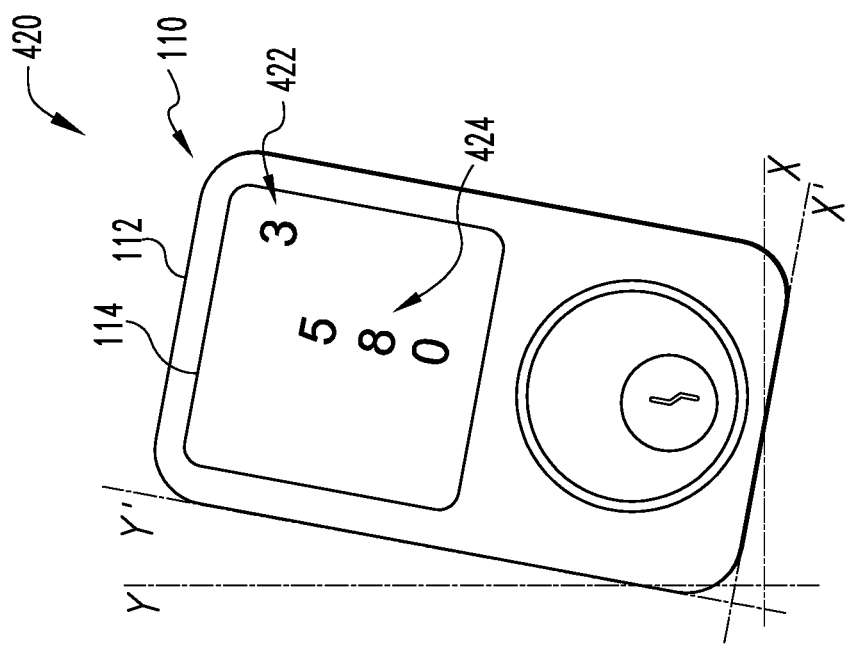

FIGS. 4A-4D illustrate various embodiments of the electronic lock 110 determining a level position (e.g., a clockwise tilt indication) with a device (e.g., an accelerometer) and displaying the level position on the keypad display 114. It is contemplated that aspects or features from the various embodiments in FIGS. 4A-4D may be combined with one another in other embodiments. FIG. 4A is illustrates a first clockwise tilt display embodiment 410, where a right-leaning diagonal 412 is a subset of keys 116 that are illuminated to indicate the electronic lock 110 is tilted clockwise. A second clockwise tilt display embodiment 420 is illustrated in FIG. 4B, where the top-rightmost key 422 (i.e. three) and a middle row portion 424 (i.e. five, eight, zero) are combined to form a subset of keys 116 that are illuminated to indicate the electronic lock 110 is tilted clockwise.

Figure 4C:
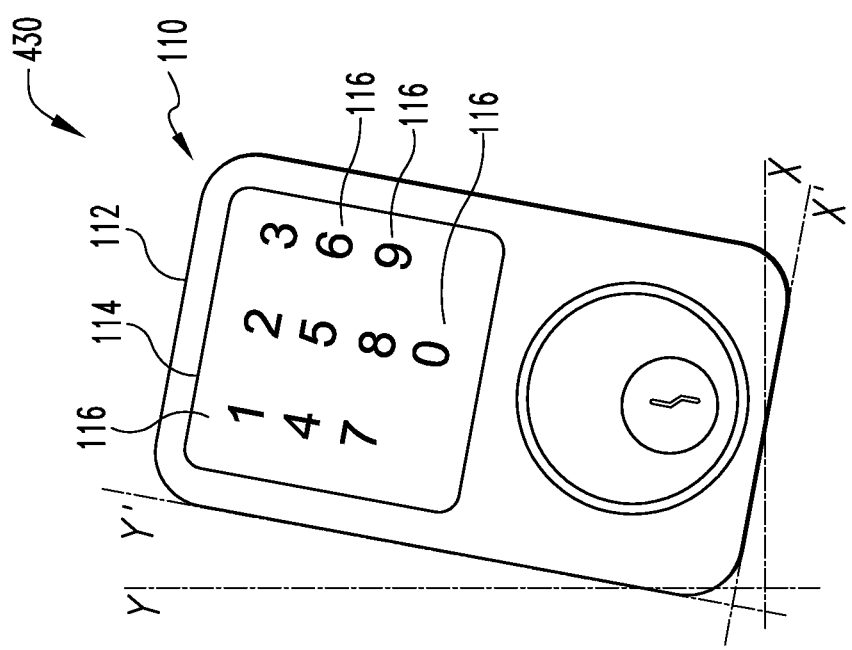

In a third clockwise tilt display embodiment 430 illustrated in FIG. 4C, all the keys 116 are illuminated in a color indicative of the electronic lock 110 being at a clockwise tilt, such as red, for example. It is contemplated that more than one color may be used to represent the degree of clockwise tilt. In certain embodiments, when the electronic lock 110 is at a clockwise tilt further from level, the keys 116 may be illuminated a first color, and when the electronic lock 110 is at a clockwise tilt closer to level, then the keys 116 may be illuminated a second color. For example, an embodiment may include a predetermined threshold set to 10° from level at which the keys 116 may be illuminated red when the degree of tilt is greater than the predetermined threshold, and the keys 116 may be illuminated yellow when the degree of tilt is equal to or less than the predetermined threshold and greater than level.

Figure 4D:
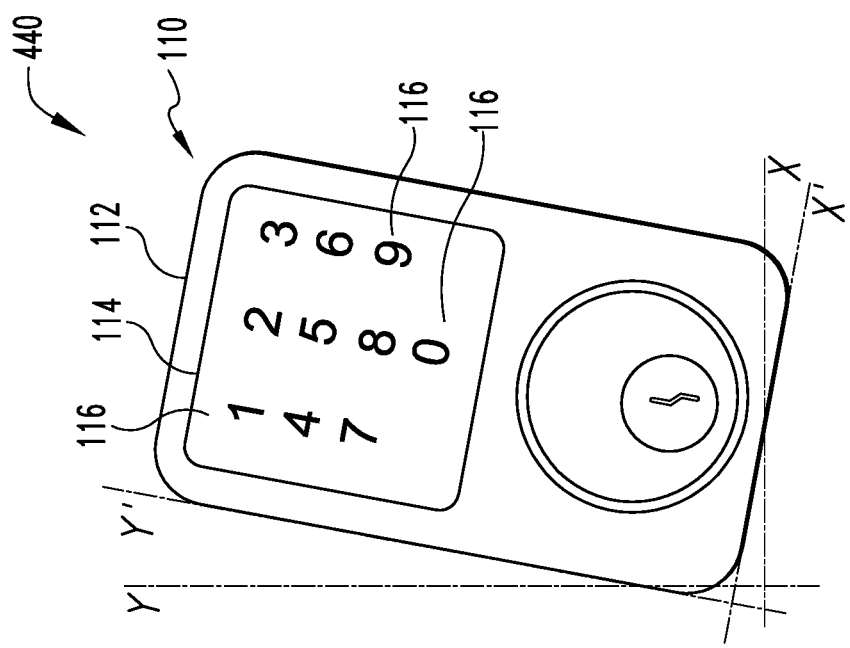

With reference to FIG. 4D, there is illustrated a fourth clockwise tilt display embodiment 440, where all the keys 116 are illuminated with a luminous intensity indicative of the electronic lock 110 being at a clockwise tilt. For example, in an embodiment where the luminous intensity becomes more intense the further away from level and the less intense the closer to level, a maximum luminous intensity may be used such that when the electronic lock 110 is at a 10° clockwise tilt, the luminous intensity may be ten percent of the maximum luminous intensity. It is contemplated that in certain embodiments the luminous intensity level may be lower the further away from level and higher the closer to level. It is contemplated that in certain embodiments the various subsets of illuminated keys, colors, and/or luminous intensities to indicate the electronic lock 110 being at a clockwise tilt may be combined.

Figure 5:
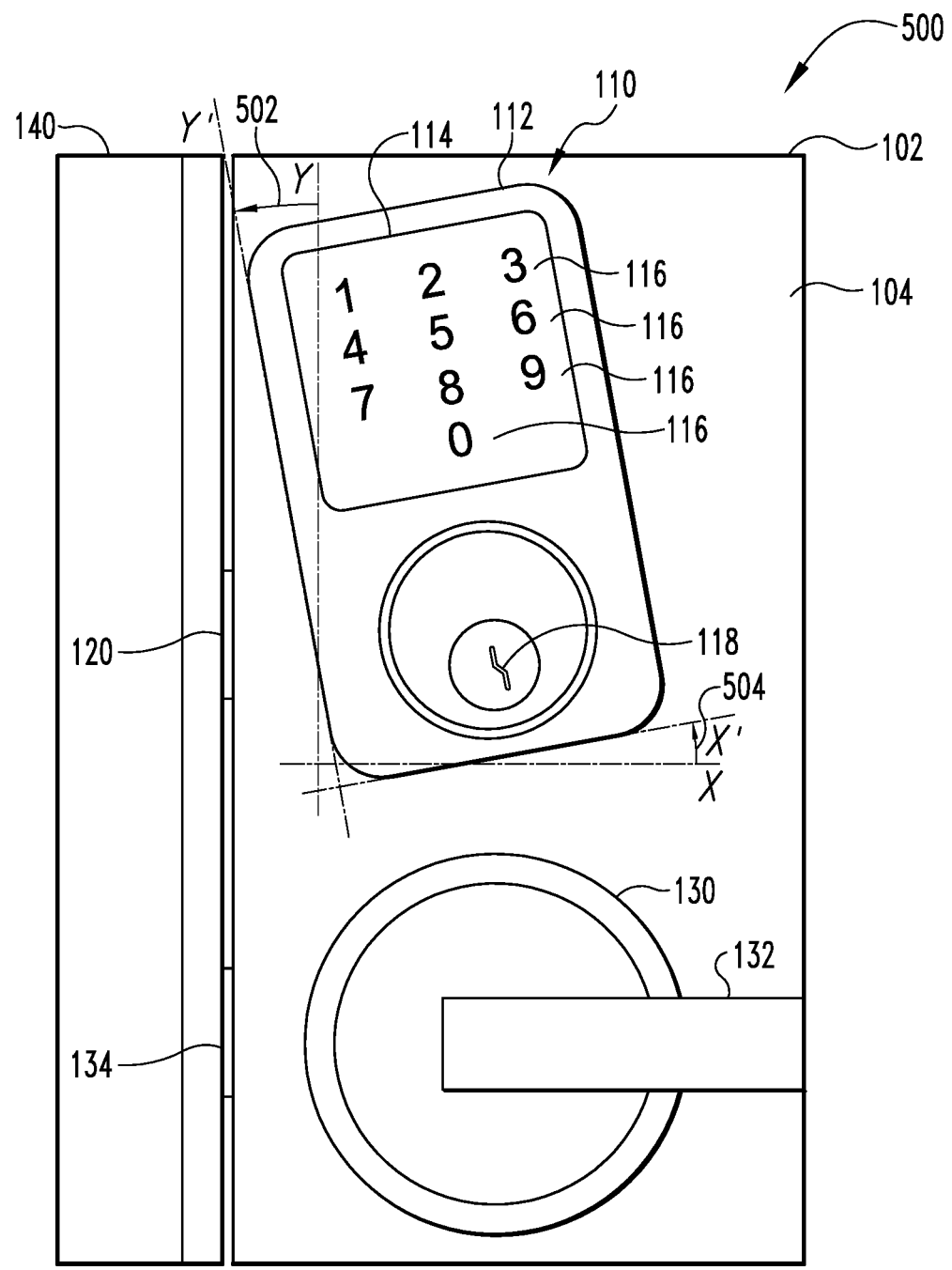
FIG. 5 is an illustration of an electronic lock with a keypad positioned at a counter-clockwise tilt.

With reference to FIG. 5, there is illustrated the electronic lock 110 positioned at a counter-clockwise tilt (i.e. at a negative degree of tilt from level). The illustrated embodiment includes a Y axis change 502 and an X axis change 504 depicting the electronic lock 110 at a −10° counter-clockwise tilt, such that the electronic lock 110 resides along an X' and Y' axes relative to the level X and Y axes, respectively. The electronic lock 110 may be positioned on the lock stile 104 at varying degrees of counter-clockwise tilt from level.

Figure 6A:
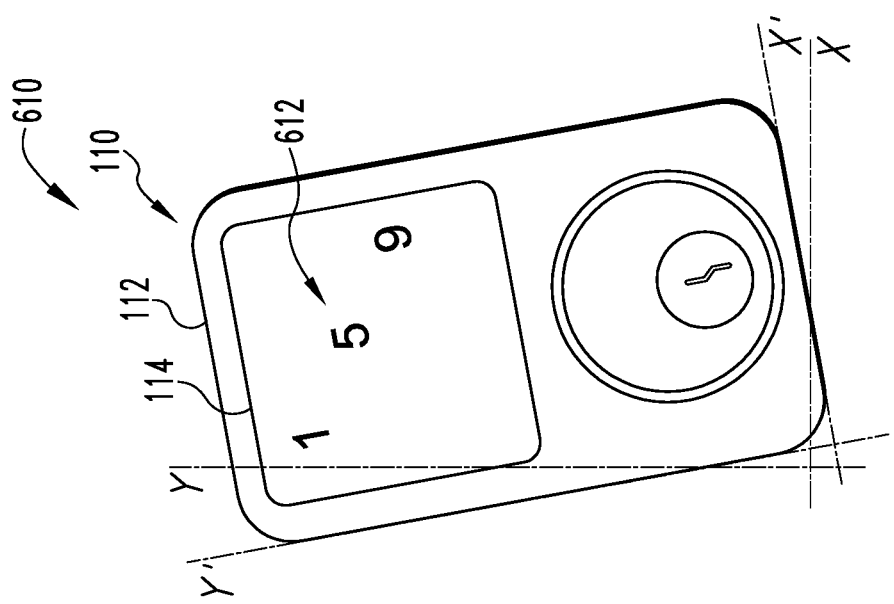
Figure 6B:
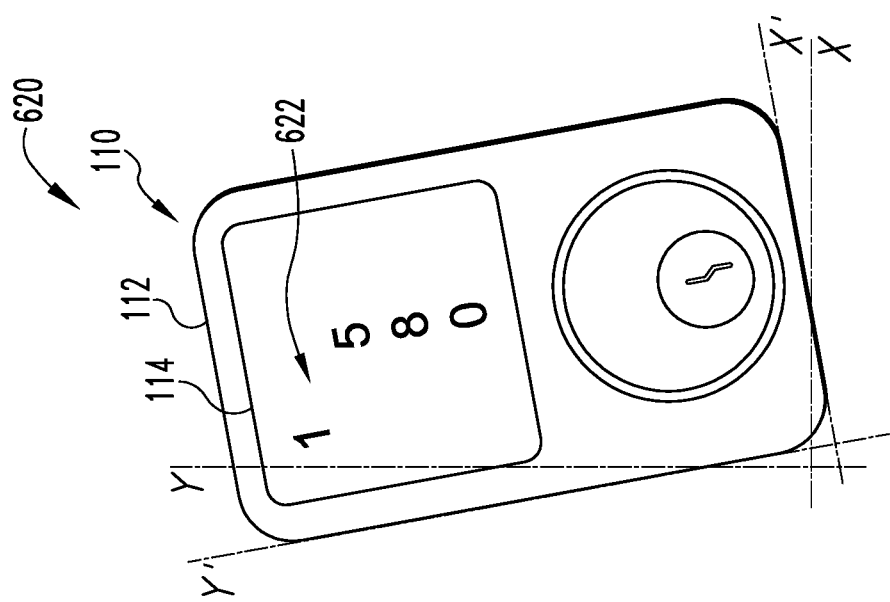

FIGS. 6A-6D illustrate various embodiments of the electronic lock 110 determining a level position (e.g., a counter-clockwise tilt indication) with a device (e.g., an accelerometer) and displaying the level position on the keypad display 114. It is contemplated that aspects or features from the various embodiments in FIGS. 6A-6D may be combined with one another in other embodiments. FIG. 6A illustrates a first counter-clockwise tilt display embodiment 610, where a left-leaning diagonal 612 is a subset of keys 116 that are illuminated to indicate the electronic lock 110 is tilted counter-clockwise. A second counter-clockwise tilt display embodiment 620 is illustrated in FIG. 6B, where the top-leftmost key 622 (i.e. one) and a middle row portion 624 (i.e. five, eight, zero) are combined to form a subset of keys 116 that are illuminated to indicate the electronic lock 110 is tilted counter-clockwise.

In a third clockwise tilt display embodiment 630 illustrated in FIG. 6C, all of the keys 116 are illuminated in a color indicative of the electronic lock 110 being at a counter-clockwise tilt, such as red, for example. It is contemplated that more than one color may be used to represent the degree of counter-clockwise tilt. In certain embodiments, when the electronic lock 110 is at a counter-clockwise tilt further from level, the keys 116 may be illuminated a first color, and when the electronic lock 110 is at a counter-clockwise tilt closer to level, then the keys 116 may be illuminated a second color. For example, an embodiment may include a predetermined threshold set to −10° from level at which the keys 116 may be illuminated red when the degree of tilt is less than the predetermined threshold, and the keys 116 may be illuminated yellow when the degree of tilt is equal to or greater than the predetermined threshold and less than level.

Figure 6D:
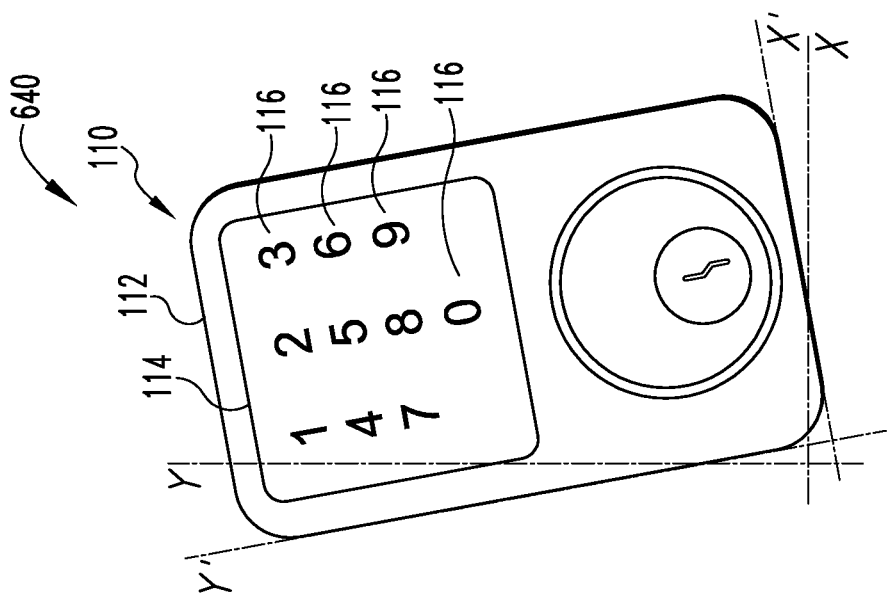

With reference to FIG. 6D, there is illustrated a fourth counter-clockwise tilt display embodiment 640, where all the keys 116 are illuminated with a luminous intensity indicative of the electronic lock 110 being at a counter-clockwise tilt. For example, in an embodiment where the luminous intensity becomes more intense the further away from level and the less intense the closer to level, a maximum luminous intensity may be used such that when the electronic lock 110 is at a −10° counter-clockwise tilt, the luminous intensity may be ten percent of the maximum luminous intensity. It is contemplated that in certain embodiments the luminous intensity level may be lower the further away from level and higher the closer to level. It is contemplated that in certain embodiments the various subsets of illuminated keys, colors, and/or luminous intensities to indicate the electronic lock 110 being at a counter-clockwise tilt may be combined.

In certain embodiments, the keys 116 may be illuminated during short periods of time, such that one or more of the keys 116 blink. For example, while the electronic lock 110 is positioned at a clockwise or a counter-clockwise tilt, one or more of the keys 116 may blink, and when the electronic lock 110 becomes level, either all of the keys 116 are illuminated, or none of the keys 116 are illuminated, whichever is specified as being assigned to indicate that the electronic lock 110 is level. Furthermore, it is contemplated that in certain embodiments, the keys 116 may either be all illuminated or none illuminated while the electronic lock 110 is positioned at a clockwise or a counter-clockwise tilt, and the keys 116 may blink when the electronic lock 110 becomes level. It is also contemplated that the frequency that one or more of the keys 116 blink may indicate that the electronic lock 110 is further or closer to level.

In certain embodiments, the electronic lock 110 may contain a battery (not shown) to power the electronic lock 110, and/or a network connectivity device (not shown) to provide a network connection to the electronic lock 110. Various embodiments are contemplated for utilizing existing features of the keypad display 114 on the electronic lock 110 in a way to convey a network signal strength of the network connectivity device and/or a battery life (e.g., a state of charge) of the battery by illuminating one or more keys 116 on the keypad display 114. The controller may be further configured to interpret the network signal strength and/or the battery life, and adjust a luminous intensity and/or a color of the light source based on the level position.

Figure 7A:
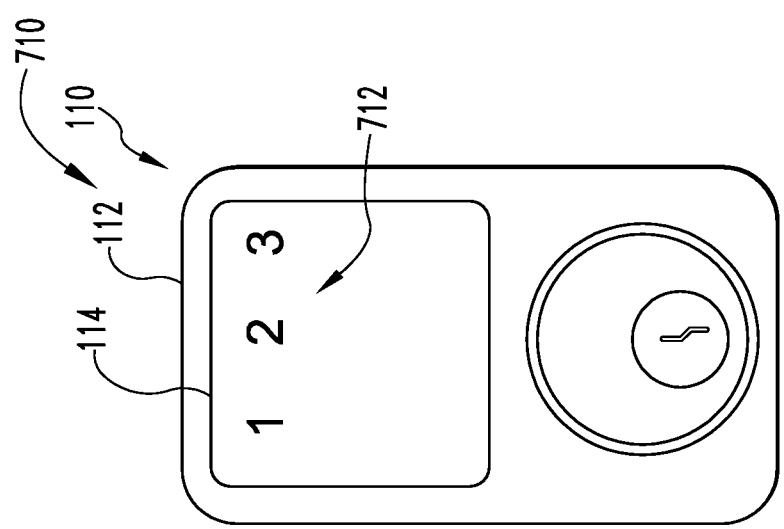
Figure 7B:
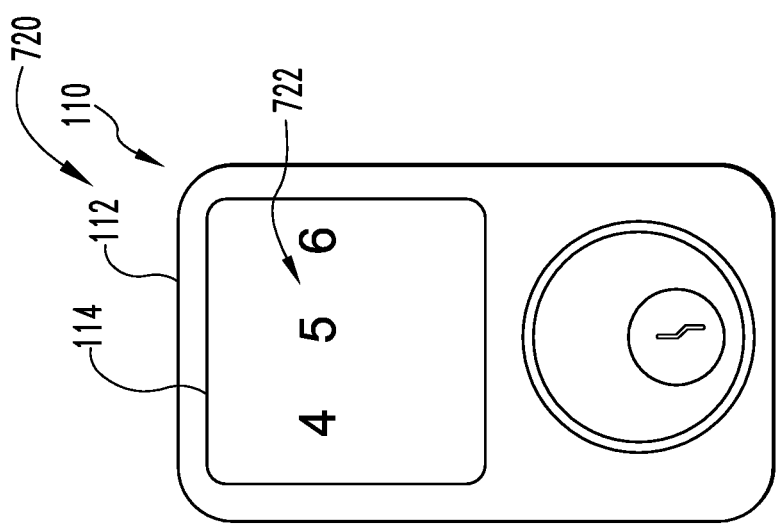

FIGS. 7A-7E illustrate various embodiments of the electronic lock 110 indicating a battery life and/or a signal strength using the keypad display 114. It is contemplated that aspects or features from the various embodiments in FIGS. 7A-7E may be combined with one another in other embodiments. With reference to FIG. 7A, there is illustrated a first life/strength display embodiment 710, where a top row 712 (i.e. one, two, and three) is a subset of keys 116 that are illuminated to indicate a low battery life or a weak network signal strength. In FIG. 7B, there is illustrated a second life/strength display embodiment 720, where a middle row 722 (i.e. four, five, and six) is a subset of keys 116 that are illuminated to indicate a medium battery life or a medium network signal strength. FIG. 7C illustrates a third life/strength display embodiment 730, where a bottom row 732 (i.e. seven, eight, and nine) is a subset of keys 116 that are illuminated to indicate a high battery life or a strong network signal strength.

Figure 7D:
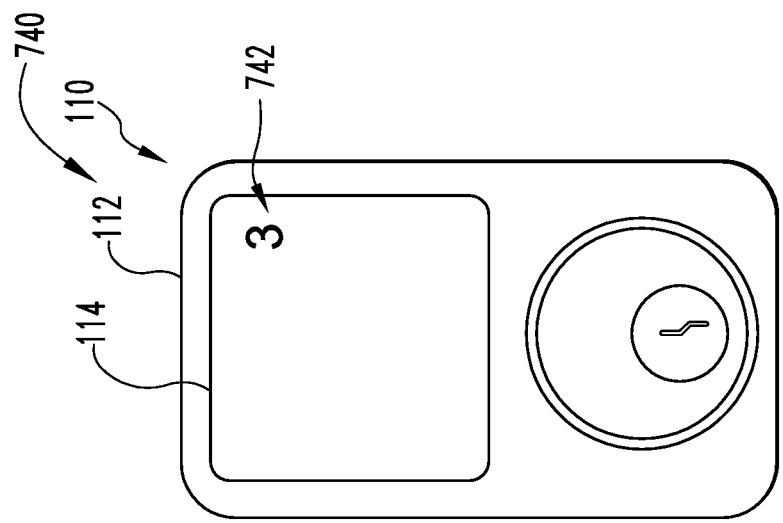

In FIG. 7D, there is illustrated a fourth life/strength display embodiment 740, where a single key 742 is illuminated to indicate the battery life and/or the network signal strength. For example, where the battery life is at 30%, the numeric key(s) representing a 30% power level will be illuminated. In the illustrated embodiment, the number "3" key, representing the tens digit of the 30% power level, is the only key of keys 116 illuminated.

It is contemplated that in some embodiments, illuminating a number key, such as the number "3" key, does not indicate a 30% battery life or signal strength, but rather the illuminated key indicates a relative battery life or signal strength. For example, illuminating the number "9" indicates a relatively higher battery life or signal strength than illuminating the number "3".

As another example, a combination of color and a single number key may be used to indicate batter life and/or signal strength. For example, In this example, a low battery life or signal strength indication could be shown as a number "1" in red and a high indication could be shown as a "9" in green. It is contemplated that other keys (e.g., number keys 2-8) may be illuminated with the same or other colors (e.g., yellow) to indicate a battery life and/or signal strength is between "1" and "9".

Figure 7E:
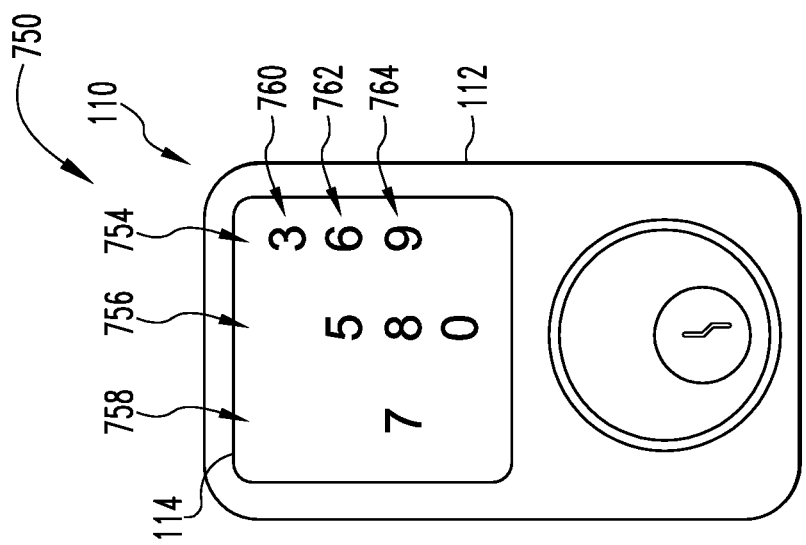

With reference to FIG. 7E, there is illustrated a fifth life/strength display embodiment 750, where a bar display 752 including one or more of three vertical bars 754, 756, and 758 may be illuminated to indicate the battery life and/or the network signal strength. In the illustrated embodiment, each of the three vertical bars 754, 756, and 758 may be illuminated to indicate the high battery life and/or the strong network signal strength. Only the two left-most vertical bars 756 and 758 may be illuminated to indicate the medium battery life and/or the medium network signal strength. The left-most vertical bar 758 may be illuminated alone to indicate a low battery life or a low network signal strength. It is contemplated that in certain embodiments the vertical bars 754, 756, and 758 may be presented in a different alignment. For example, the vertical bars 754, 756, and 758 may be presented in a reverse order, where vertical bar 758 represents the highest life/strength of the bar display 752 and vertical bar 754 may be the lowest life/strength of the bar display 752.

It is further contemplated that in certain embodiments the bar display 752 may be represented by horizontal bars 760, 762, and 764, where each of the three horizontal bars 760, 762, and 764 may be illuminated to indicate the high battery life and/or the strong network signal strength. Only the two top-most vertical bars 760 and 762 may be illuminated to indicate the medium battery life and/or the medium network signal strength. The top-most horizontal bar 760 may be illuminated alone to indicate a low battery life or a low network signal strength. It is still further contemplated that in certain embodiments the horizontal bars 760, 762, and 764 may be presented in a different alignment. For example, the horizontal bars 760, 762, and 764 may be presented in a reverse order, where horizontal bar 760 may represent the highest life/strength of the bar display 752 and horizontal bar 764 may represent the lowest life/strength of the bar display 752. In certain embodiments, the keys 116 may be illuminated a first color to indicate the low battery life and/or the weak network signal strength, a second color to indicate the medium battery life and/or the medium network signal strength, and/or a third color to indicate the high battery life and/or the strong network signal strength.

It is contemplated that in certain embodiments one or more thresholds may be used to determine whether the battery life is low, medium, or high, and/or the network signal strength is weak, medium, or strong. For example, a first threshold and second threshold may be provided, such that when the battery life and/or signal strength is below the first threshold, the first color is displayed, and when the battery life and/or signal strength is equal to or above the first threshold and below the second threshold, the second color is displayed, and when the battery life and/or signal strength is equal to or above the second threshold, the third color is displayed. It is contemplated that more or fewer thresholds may be used and may correspond to more or fewer colors.

Figure 8B:
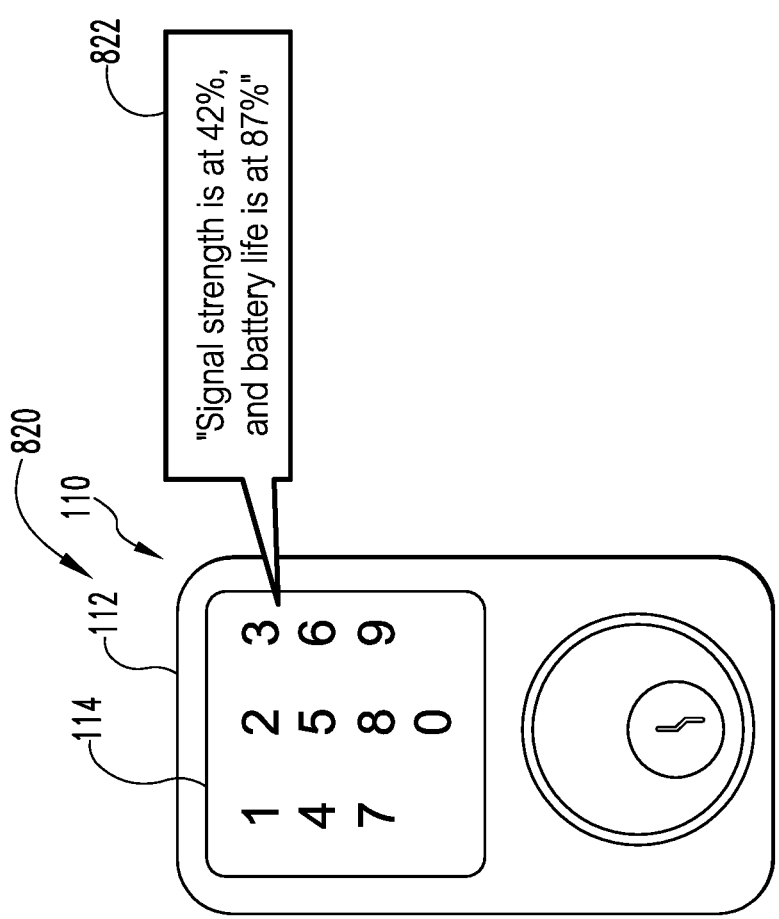
Figure 8C:
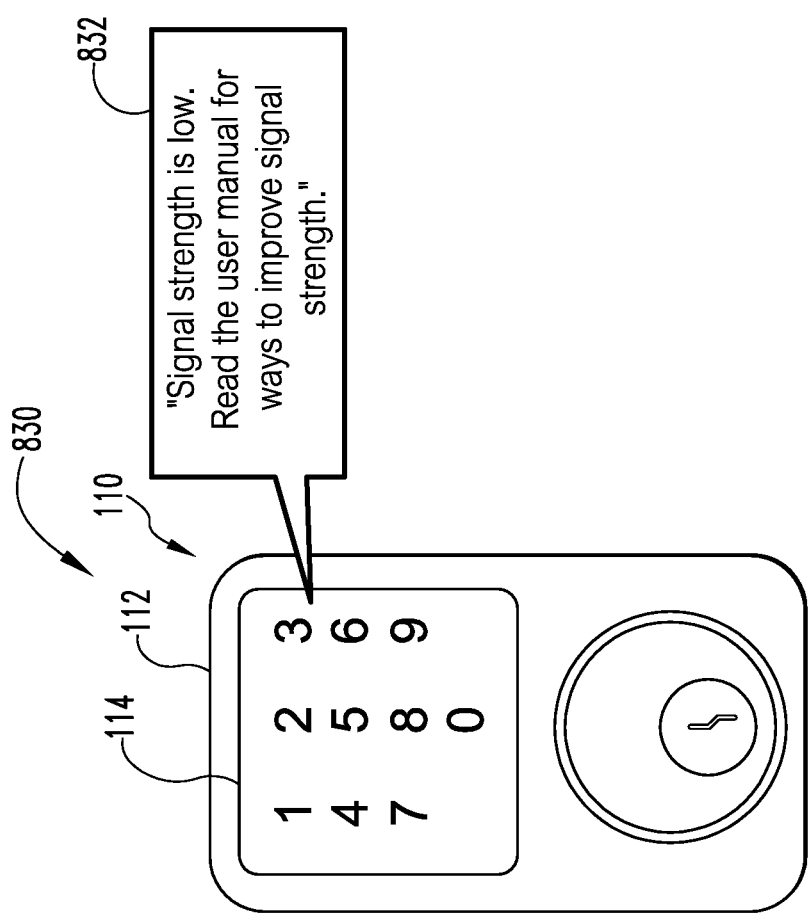

FIGS. 8A-8C illustrate various embodiments of the electronic lock 110 indicating a battery life and/or signal strength using an audible device. The controller may be further configured to communicate with the audible device, interpret the network signal strength and/or the battery life, and adjust the audible device based on the level position. It is contemplated that aspects or features from the various embodiments in FIGS. 8A-8C may be combined with one another in other embodiments. FIG. 8A illustrates a first audible feedback embodiment 810, where an audible tone is emitted, such as a series of beeps, for example, to provide audible feedback to the user to indicate the battery life of the battery and/or the network signal strength of the network connectivity device. In the first audible feedback embodiment 810, the electronic lock 110 is emitting an audible tone 812 as a series of "beeps" corresponding to the battery life and/or network signal strength. It is contemplated that in certain embodiments, the "beep" tones may become faster and/or louder the closer the battery life and/or network signal strength is to being zero. In other embodiments, the "beep" tones may become faster and/or louder the closer the battery life and/or network signal strength is to being at maximum.

With reference to FIG. 8B, a second audible feedback embodiment 820 is illustrates an audible speech being emitted from the electronic lock 110, such as from a voice emulation device, for example, to provide audible feedback to the user to indicate the battery life and/or the network signal strength. In certain embodiments, the electronic lock 110 may emit one or more messages directed toward providing audible feedback of the battery life and/or the network signal strength. In the second audible feedback embodiment 820 illustrated in FIG. 8B, the electronic lock 110 is emitting an example of a combined message 822: "Signal strength is at 42%, and batter life is at 87%." The combined message 822 is intended to be exemplary and non-limiting, further examples of audible feedback messages for providing audible feedback of the battery life and/or the network signal strength are contemplated.

FIG. 8C illustrates a third audible feedback embodiment 830 similar to the second audible feedback embodiment 820, but the audible feedback provides additional assistance and/or further direction for resolving the low battery life and/or the weak wireless connection signal. In the third audible feedback embodiment 830 illustrated in FIG. 8C, the electronic lock 110 is emitting an example of a directive message 832: "Signal strength is low. Read the user manual for ways to improve signal strength." The directive message 832 is intended to be exemplary and non-limiting, further examples of audible feedback messages for providing additional assistance and/or further direction for resolving the low battery life and/or the weak wireless connection signal are contemplated.

It is contemplated that the audible tone and/or voice emulation feedback may be used as an alternative to or in combination with the life/strength display embodiments, as well as the other illustrated embodiments, including the level, clockwise tilt, and counter-clockwise tilt illumination indicator embodiments. It is further contemplated that certain aspects or features from all of the various embodiments in the present application may be combined with one another in other embodiments. Furthermore, it is contemplated that in other embodiments, indicators other than the numeric keys on a display may be used to convey information.

Various aspects of the apparatuses and methods are disclosed herein. For example, one aspect involves a method, including determining a level position of a lock including a keypad, determining at least one of a plurality of keys of the keypad to illuminate based on the level position, and illuminating the at least one of the keys on the keypad to indicate the level position. In another embodiment, the method further includes illuminating the at least one of the keys with a light source positioned behind the keys.

In another embodiment of the method, the level position includes a clockwise tilt indication, a counterclockwise tilt indication, and a level indication. In one refinement of the embodiment, illuminating the at least one of the keys includes illuminating at least one of a row of the keys, a column of the keys, and a diagonal of the keys. In a further refinement, illuminating at least one of the plurality of keys based on the level indication comprises illuminating one of the row of the keys and the column of the keys. In another refinement, illuminating at least one of the keys based on the clockwise tilt indication includes one of illuminating the diagonal of the keys extending from a bottom-left key to a top-right key, and illuminating the top-right key and at least a portion of a middle column of the keys. In still another refinement illuminating at least one of the plurality of keys based on the counterclockwise indication includes one of illuminating the diagonal of the keys extending from a top-left key to a bottom-right key, and illuminating the top-left key and at least a portion of a middle column of the keys.

In still another embodiment, illuminating the at least one key one of a first and a second color, where the first color corresponds to a level indication and the second color corresponds to a not-level indication. Yet another embodiment further includes determining an illumination intensity level based on the level position, wherein an intensity of the light source is based on the illumination intensity level. In a refinement of the embodiment, the intensity of the light source is greater as the lock is further from level and lower as the lock is closer to level.

Another aspect includes an electronic lock, including a keypad including a plurality of keys and a light source configured to illuminate at least one of the plurality of keys, and a controller operably connected to the keypad, wherein the controller is configured to determine a level condition of the electronic lock and control operation of the light source based on the level condition. In one refinement of the embodiment, the controller is further configured to determine the level condition based on an output of an accelerometer. In another refinement of the embodiment, the controller is further configured to adjust at least one of a color and a luminous intensity of the light source. In still another refinement of the embodiment, the embodiment further includes an audible feedback emitter device configured to emit an audible feedback, wherein the controller is further configured to adjust the audible feedback based on the level condition. In yet another refinement of the embodiment, the audible feedback emitter device includes a voice emulator.

Still another aspect includes a method that includes determining at least one of a state of charge of a battery and a signal strength of a wireless connection of an electronic lock including a keypad, determining one of a plurality of keys of the keypad to illuminate based on at least one of the state of charge and the signal strength, and illuminating the one key on the keypad to indicate at least one of the state of charge and the signal strength, wherein a numeric value on the one key corresponds to one of the state of charge and the signal strength.

In one embodiment of the method, the method further includes illuminating the one key with a light source positioned behind the keys. In another embodiment, the state of charge comprises a percentage of battery life, and determining the one key to illuminate is further based on a tens digit of the percentage of battery life. In yet another embodiment, the method further includes illuminating the one key an indicative color that corresponds to one of the relative state of charge and the relative signal strength. In one refinement of the embodiment, the indicative color includes one of a first color, a second color, and a third color, wherein the first color corresponds to one of the state of charge and the signal strength being less than a first threshold, the second color corresponds to one of the state of charge and the signal strength being less than a second threshold and greater than or equal to the first threshold, and the third color corresponds to one of the state of charge and the signal strength being greater than or equal to the second threshold.

While the invention has been illustrated and described in detail in the drawings and foregoing description, the same is to be considered as illustrative and not restrictive in character, it being understood that only certain exemplary embodiments have been shown and described and that all changes and modifications that come within the spirit of the inventions are desired to be protected.

It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method, comprising:
   determining a level position of a lock including a keypad;
   determining at least one of a plurality of keys of the keypad to illuminate based on the level position; and
   illuminating the at least one of the keys on the keypad to indicate the level position.

2. The method of claim 1, further comprising:
   illuminating the at least one of the keys with a light source positioned behind the keys.

3. The method of claim 1, wherein the level position includes a clockwise tilt indication, a counterclockwise tilt indication, and a level indication.

4. The method of claim 3, wherein illuminating the at least one of the keys includes illuminating at least one of a row of the keys, a column of the keys, and a diagonal of the keys.

5. The method of claim 4, wherein illuminating at least one of the plurality of keys based on the level indication comprises illuminating one of the row of the keys and the column of the keys.

6. The method of claim 4, wherein illuminating at least one of the keys based on the clockwise tilt indication includes one of illuminating the diagonal of the keys extending from a bottom-left key to a top-right key, and illuminating the top-right key and at least a portion of a middle column of the keys.

7. The method of claim 4, wherein illuminating at least one of the plurality of keys based on the counterclockwise indication includes one of illuminating the diagonal of the keys extending from a top-left key to a bottom-right key, and illuminating the top-left key and at least a portion of a middle column of the keys.

8. The method of claim 1, further comprising:
   illuminating the at least one key one of a first and a second color, wherein the first color corresponds to a level indication and the second color corresponds to a not-level indication.

9. The method of claim 1, further comprising:
   determining an illumination intensity level based on the level position, wherein an intensity of the light source is based on the illumination intensity level.

10. The method of claim 9, wherein the intensity of the light source is greater as the lock is further from level and lower as the lock is closer to level.

11. An electronic lock, comprising:
    a keypad including a plurality of keys and a light source configured to illuminate at least one of the plurality of keys; and
    a controller operably connected to the keypad, wherein the controller is configured to determine a level condition of the electronic lock and control operation of the light source based on the level condition.

12. The electronic lock of claim 11, wherein the controller is further configured to determine the level condition based on an output of an accelerometer.

13. The electronic lock of claim 11, wherein the controller is further configured to adjust at least one of a color and a luminous intensity of the light source.

14. The electronic lock of claim 11, further comprising an audible feedback emitter device configured to emit an audible feedback, wherein the controller is further configured to adjust the audible feedback based on the level condition.

15. The electronic lock of claim 11, wherein the audible feedback emitter device includes a voice emulator.

* * * * *